Nov. 22, 1966 R. V. GOORDMAN 3,287,653

NEUTRALIZED DIRECT-COUPLED DIFFERENTIAL AMPLIFIER INCLUDING POSITIVE AND NEGATIVE FEEDBACK LOOPS

Filed March 27, 1964

INVENTOR
R. V. GOORDMAN
BY [signature]
ATTORNEY

United States Patent Office 3,287,653

Patented Nov. 22, 1966

3,287,653

NEUTRALIZED DIRECT-COUPLED DIFFERENTIAL AMPLIFIER INCLUDING POSITIVE AND NEGATIVE FEEDBACK LOOPS

Robert V. Goordman, Hackettstown, N.J., assignor to Bell Telephone Laboratories, Incorporated, New York, N.Y., a corporation of New York Filed Mar. 27, 1964, Ser. No. 355,320
8 Claims. (Cl. 330—18)

This invention relates to transistor amplifiers having high input impedance and broad band frequency response.

In obtaining these characteristics, it is desirable to use the so-called differential amplifier configuration because this configuration permits application of loop negative feedback in a manner that renders the aforesaid characteristics relatively independent of the signal source impedance and the load impedance.

The initial transistor of a differentially connected pair of transistors in a differential amplifier is a so-called common collector amplifier stage. It has been recognized that the input impedance of a common collector transistor amplifier is limited by the collector-to-base impedance of the transistor. Moreover, this collector-to-base impedance contributes a substantial capacitance to the input impedance. The width of the frequency band for a given flatness of power gain is limited by this capacitance.

Previous attempts to neutralize the collector-to-base impedance of common collector transistor amplifier stages have used two different approaches. This first involves direct-coupled feedback to the common collector of the input stage. The biasing problems thereby created result in configurations characterized by gain and frequency responses that vary markedly whenever the signal source impedance or the load impedance is changed. In general, such configurations are not differential amplifiers and do not use loop negative feedback. The second approach uses a blocking capacitor in the neutralizing feedback path to the common collector of the input stage so that bias may be separately provided. Obviously, a blocking capacitor limits the low-frequency gain. Such a blocking capacitor needs short, low-inductance leads, so that its large physical bulk must lie close to other circuit components. The distributed capacitances resulting from this proximity greatly reduce high frequency gain.

It is an object of this invention to provide direct-coupled neutralization of the collector-to-base impedance of the input common collector stage in a transistor differential amplifier, while retaining the advantages of direct-coupled loop negative feedback in such a differential amplifier.

According to the invention, the emitter electrodes of the input and second transistors of a differential amplifier are biased through a common resistor at a direct current potential in one polarity with respect to a common terminal of the input; while the collector electrodes are biased at a direct current potential in the opposite polarity with respect to the common terminal, the common collector of the input transistor being supplied with bias current serially through a neutralizing feedback circuit. This arrangement permits the signal source to be direct-coupled between the base electrode of the input transistor and the common terminal, while a loop negative feedback circuit is direct-coupled between the base electrode of the second transistor and the common terminal.

According to one feature of the invention, the neutralizing feedback circuit couples a bias voltage of a subsequently cascaded transistor amplifier stage to the collector circuit of the input transistor, while superimposed upon this bias voltage is a signal voltage that causes the potential of the collector electrode of the input transistor to rise and fall in synchronism with that of the base electrode of the input transistor.

According to a second feature of the invention, the negative feedback circuit feeds a part of the bias current of a subsequent cascaded transistor amplifier stage serially through the base-emitter circuit of the second transistor, while superimposed upon this bias current is a signal that causes the potential of the base electrode of the second transistor to rise and fall in synchronism with the potential of the base electrode of the input transistor.

A third feature of the invention involves feeding different parts of the bias current of the same subsequently cascaded stage through the respective negative feedback and neutralizing feedback circuits, while a constant voltage device, such as a Zener diode, connected serially in the bias current path of that subsequent stage between the negative feedback and neutralizing feedback circuits maintains adequate bias voltages on the electrodes of the input and second transistors over wide ranges of negative feedback ratios and neutralizing feedback ratios.

As a fourth feature of the invention, the subsequently cascaded stage is a so-called "paraphase" or "split-phase" transistor amplifier, permitting loads to be driven either in the collector circuit or emitter circuit of this stage, or in both simultaneously. For a collector circuit load, automatic volume control is conveniently accomplished in the emitter circuit by control of the signal current; and the multiplication of the collector-to-base capacitance of this stage may be reduced by an additional transistor amplifier stage in the so-called "grounded base" or "common base" configuration. The added common base stage also increases the flexibility in application of the amplifier wherever power amplification is desired.

Further features and advantages of the invention will become apparent from the following detailed description and the drawing, in which.

Figure 1:
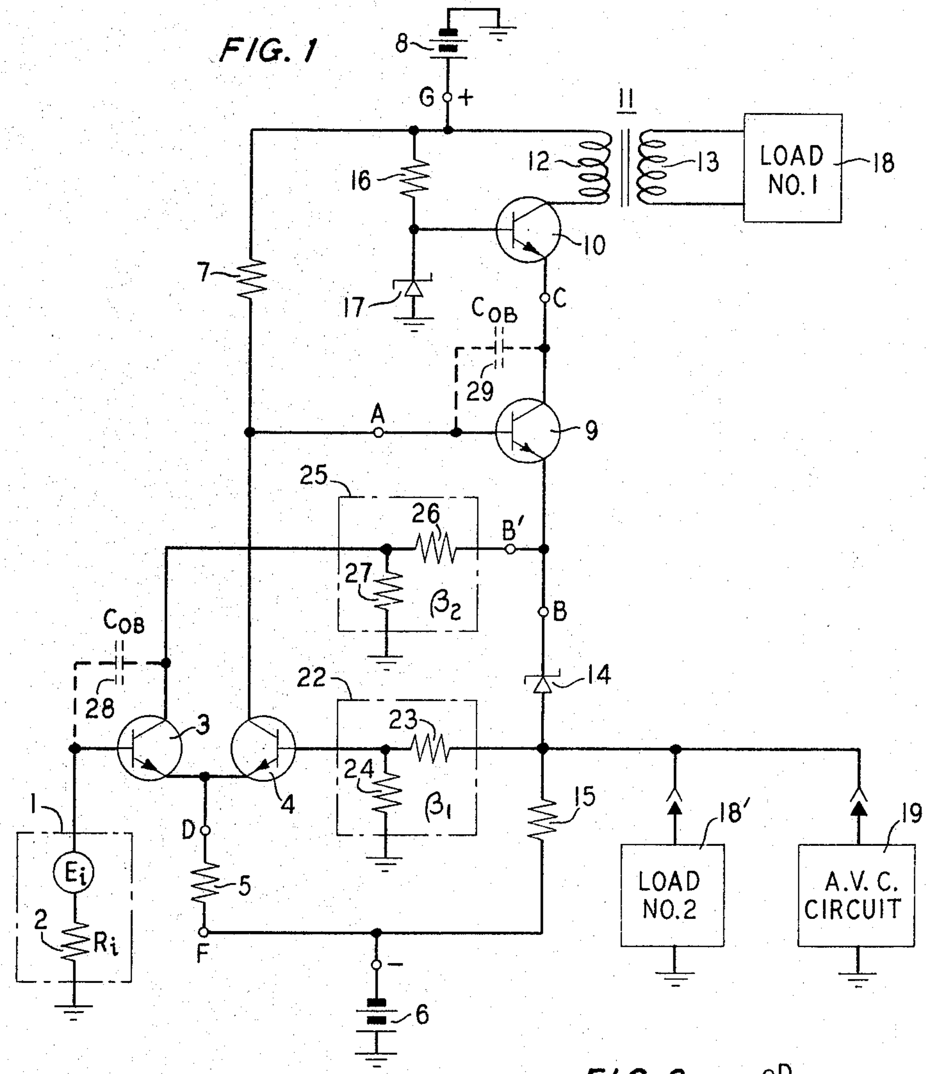
FIG. 1 is a schematic illustration of a preferred embodiment of the invention.

In FIG. 1, a signal source 1 having an arbitrary internal impedance 2 is connected between ground and the base of transistor 3. Transistor 4 is connected in differential amplifier configuration with transistor 3. A common emitter resistance 5 is connected between their emitters at point D and the negative terminal of battery 6, at point F. The positive terminal of battery 6 is connected to ground. The collector of transistor 4 is connected through collector load impedance 7 to the positive terminal of battery 8, at point G; and the negative terminal of battery 8 is connected to ground. Batteries 6 and 8 may comprise separate cells or a common bias supply that is provided with an intermediate potential connection, or tap, that is connected to ground. Transistors 3 and 4 are maintained in close thermal coupling so that temperature-dependent changes in their characteristics tend to produce canceling effects at the collector of transistor 4.

The collector electrode of transistor 4 is connected to the base electrode of output transistor 9 at point A. The collector electrode of transistor 9 is connected in series feed arrangement through the emitter-collector circuit of transistor 10 and through the primary winding 12 of transformer 11 to the positive terminal of battery 8. The emitter of transistor 9 is connected to the cathode of Zener diode 14; and emitter resistor 15 is connected between the anode of Zener diode 14 and the negative terminal of battery 6. The base electrode of transistor 10 is biased through resistor 16, which is connected to the positive terminal of battery 8. The cathode of constant-voltage Zener diode 17 is connected to the base electrode of transistor 10; and its anode is connected to ground.

It should be noted that the voltages of batteries 6 and 8 are chosen with respect to the remaining circuit components so that the emitters of transistors 3 and 4 are biased at a direct current voltage more negative than the potential of the ground or common terminal of the input by the amount of their average base-emitter voltage drops. Therefore, the base electrodes of transistors 3 and 4 are effectively biased at ground potential; and complete direct-coupling of the circuit is greatly facilitated because signal source 2 usually has no inherent direct current voltage bias.

Load 18 is connected in the preferred position for a load, that is, across the secondary winding 13 of transformer 11. Alternatively or simultaneously, load 18′ may be connected across emitter resistor 15. When only the collector load 18 is used, an automatic volume control circuit 19 may be connected across emitter resistor 15. Automatic volume control circuit 19 includes a source of an automatic volume control signal, derived either from emitter resistor 15 or from elsewhere in the circuit, and a nonlinear level-sensitive device, for example the PIN diode described in A. Uhlir, Jr., Patent No. 3,008,089, issued November 7, 1961. In the case that the automatic volume control signal is derived from some part of the circuit other than resistor 15, a blocking capacitor is connected serially between resistor 15 and the remainder of automatic volume control circuit 19.

Loop negative feedback is provided by the network labeled 22. Resistor 23 is connected between the anode of Zener diode 14 and the base of transistor 4. Resistor 24 is connected from the base of transistor 4 to ground. The ratio of the net resistance from the base of transistor 4 to ground to the sum of this net resistance and the resistance of resistor 23 may be designated the negative feedback ratio $\beta_1$. Network 22 also provides the base-emitter bias current for transistor 4.

According to one aspect of the invention, neutralizing feedback and bias for the collector electrode of input transistor 3 are provided by the network labeled 25. Resistor 26 is connected from the cathode of Zener diode 14, according to the preferred arrangement of FIG. 1, to the collector of transistor 3. Resistor 27 is connected from the collector of transistor 3 to ground. The ratio of the resistance of the resistor 27 to the sum of the resistance of the resistor 26 and resistor 27 may be designated the neutralizing feedback ratio, $\beta_2$.

It may be noted that transistors 3, 4, 9 and 10 are shown as NPN transistors, a type well known in the art. Other types, such as PNP types, could also be used, as well as additional stages of amplification, provided appropriate phase relationships, as described hereinafter, are preserved.

Transformer 11 is preferably a high quality linear transformer having low leakage inductance.

In operation, source 1 applies a signal voltage across the base-emitter junction of transistor 3, in series with the input circuit of transistor 4. Source 1 also applies the signal across the base-collector junction of transistor 3, including the base-to-collector capacitance 28, and across the output, i.e., resistor 27, of neutralizing feedback circuit 25. Because the emitter resistor 5 transmits the signal from transistor 3 to transistor 4, transistor 3 may be said to be connected as a common collector amplifier, and transistor 4 may be said to be connected as a common base amplifier.

The varying voltage applied across the emitter-base junction of transistor 4 causes a varying voltage to be developed across the collector load resistor 7 of transistor 4.

The varying voltage existing at the collector of transistor 4 is applied across the base-emitter junction of transistor 9, Zener diode 14, resistor 15, and battery 6, all in series. It is also applied across the base-collector junction of transistor 9, including the base-to-collector capacitance 29, and across the emitter-base circuit of transistor 10.

The varying voltage appearing at the collector of transistor 9, point C, is primarily a result of the signal between base and emitter of transistor 9, which controls the emitter-to-collector current of transistor 9. The net voltage at the collector of transistor 9 is applied across the base-emitter junction of transistor 10 and Zener diode 17 in series, this combination providing a fairly low impedance path compared to the impedance which primary winding 12 would present to the collector of transistor 9 if transistor 10 were absent from the circuit. Thus, the common-base amplifier comprising transistor 10 reduces the Miller effect, that is, the effective multiplication of the collector-to-base capacitance 29 of transistor 9, as a result of the reduction of the collector load impedance for transistor 9. The signal across the base-emitter junction of transistor 10 develops a corresponding signal across windings 12 and 13 of transformer 11 and across load 18. To the extent that transformer 11 is an ideal transformer, the impedance of load 18 appears across primary winding 12, multiplied by the square of the ratio of primary winding turns to secondary winding turns. Common-base buffer amplifier transistor 10 has a low input impedance and a high output impedance. Transformer 11 matches the load impedance to this output impedance. Transistor 10 simultaneously provides increased isolation and power gain and presents a low load impedance to transistor 9 to reduce the effective multiplication of the collector-to-base capacitance 29 of transistor 9, as compared to the multiplication resulting from connecting transformer 11 directly to the collector of transistor 9.

The varying signal current flowing from battery 8 serially through the collector-emitter paths of transistors 9 and 10 divides; and the major portion flows through Zener diode 14 and the parallel combination of resistor 15 and either load 18′ or automatic volume control circuit 19.

Because loads may be used in both the collector and emitter circuits of transistor 9, it may be designated a split-phase or paraphase amplifier. The feedback signals developed in its emitter circuit are linearly related to the input and output signals, regardless of load location. Feedback networks 25 and 22 are minor current shunts or loads across portions of this main current path.

The signal appearing at the anode of Zener diode 14, as multiplied by the feedback ratio $\beta_1$ of circuit 22, is applied across the series combination of the base-emitter junction of transistor 4, common emitter resistor 5 and battery 6. The resulting voltage across resistor 5 is in phase with the voltage of signal source 1 and reduces the signal current through the base-emitter junction of transistor 3. The feedback signal therefore provides negative feedback and effectively increases one component of the input impedance that is presented to source 1.

According to the invention, the signal voltage appearing at the cathode of Zener diode 14, as multiplied by the feedback ratio $\beta_2$, is applied between the collector of transistor 3 and ground. This voltage is in phase with the voltage of source 1 and reduces the signal current through the base-to-collector impedance, including base-to-collector capacitance 28, of transistor 3; and, therefore, it effectively increases the other component of the input impedance that is presented to source 1. This sort of neutralizing feedback might be called positive feedback because it tends to increase the voltage across the base-emitter junction of transistor 3. However, "neutralizing feedback" is considered a more informative term.

Complete neutralization of the collector-to-base impedance of transistor 3 is entirely possible because transistor 4 can produce voltage amplification between the input and point B′ if the negative feedback ratio $\beta_1$ is less than unity. For complete neutralization, $\beta_2$ should maintain a proportionality to $\beta_1$ in which $\beta_2$ is slightly greater than $\beta_1$ to make up for signal losses around the circuit. Thus, $\beta_1$ must always be less than unity for complete neutralization. Then, the voltages on the collector and the base of transistor 3 are continuously virtually equal, and virtually no current flows between the base electrode and the collector electrode. The effective base-to-collector impedance of transistor 3 is virtually indefinite, and the capacitance 28 is neutralized.

Tests of the completely neutralized amplifier of FIG. 1 without automatic volume control circuit 19 show that phase shift through the amplifier is virtually undetectable. In fact, the amplifier exhibits, between its half-power frequencies, 0 cycles per second and 500 megacycles per second, a barely detectable pure time delay, which is not properly called phase shift. Another notable characteristic of the tested amplifier is that its second harmonic nonlinear distortion is even lower than its third harmonic nonlinear distortion.

Another of the unusual qualities of the present circuit is that the base-to-collector impedance of transistor 3 may be substantially over-neutralized without producing oscillations in the circuit. Over-neutralization occurs whenever the voltage with respect to ground on the collector of transistor 3 is greater in magnitude than, and in phase with, the input voltage across source 1. Under these conditions, energy is fed back into source 1 through the base-to-collector impedance of transistor 3, so that a greater signal current flows between base and emitter of transistor 3 and signal voltages tend to be increased all around the loop. This effect will tend to increase with frequency but will tend to be strongest at a particular frequency determined by the capacitance 28 and various inductances associated with transistor 3, source 1 and their leads, since the base-to-collector impedance of transistor 3 is no longer completely neutralized. However, for a neutralizing feedback ratio $\beta_2$ beyond that required for complete neutralization, the loop negative feedback is effective over a surprisingly large range of negative feedback ratios $\beta_1$, to prevent the circuit from bursting into oscillation.

Another feature of the invention is that the influence of Zener diode 14 in stabilizing biases within the circuit is more pervasive than is immediately apparent. First, it maintains the collector-to-base direct current voltage of transistor 3 in the active region for a large range of neutralizing feedback ratios, $\beta_2$. Moreover, since the direct current voltage drop across the base-emitter junction of transistor 9 is relatively small, Zener diode 14 also stabilizes the collector direct current voltage of transistor 4 with respect to the base direct current voltage of transistor 4 to a greater extent than could resistors 5 and 7 without such assistance. Such bias stability increases flexibility in the design and use of the circuit, and also protects the transistors from excessive voltages across the collector-base region.

The circuit of FIG. 1 may be readily modified to permit special uses thereof. If resistor 23 is a forward-biased diode, the amplifier voltage gain is a decreasing logarithmic function of diode biasing current over a limited range of diode biasing current. This result occurs because the negative feedback ratio $\beta_1$ increases as increasing diode biasing current reduces the dynamic resistance of the diode, so that the amplifier voltage gain decrease to unity asymptotically from values greater than unity.

Conversely, if resistor 24 is a forward-biased diode the amplifier voltage gain is approximately an increasing exponential function of diode biasing current over a limited range of diode biasing current. This result occurs because the negative feedback ratio $\beta_1$ decreases as the increasing diode biasing current reduces the dynamic resistance of the diode, so that the amplifier voltage gain increases from its lower limit of approximately unity. The foregoing relationships are only approximate and dependent on the exact nonlinearity of the diode voltage-current characteristics.

The latter modification of the negative feedback circuit 24 would make the amplifier very useful in measurements, for example, power measurements, in which the transducer provides an output voltage that is an increasing logarithmic function of the measured quantity. The transducer would simply be used as signal source 1; and the amplifier with diode resistance 24 would provide an output voltage that is a linear function of the measured quantity.

Several modifications of the basic circuit can be made, whenever desirable. For example, the circuit of FIG. 2 can be substituted for resistor 5 in order to improve the amplifier characteristic known in the art as common mode rejection.

The collector of transistor 31 is connected to the emitters of transistors 3 and 4, and resistor 34 is connected serially between its emitter and the negative terminal of battery 6. From the base of transistor 31, resistor 32 is connected to ground; and resistor 33 is connected to the negative terminal of battery 6.

Figure 2:
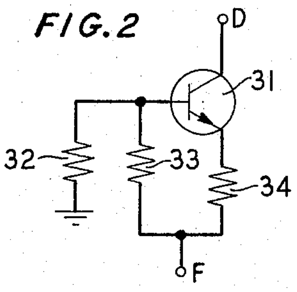
FIG. 2 is a schematic illustration of an alternative bias circuit for the emitters of the differentially connected transistors shown in FIG. 1.

The arrangement of FIG. 2 essentially provides an incremental resistance that is relatively high, for good common mode rejection, and a direct current resistance that is relatively low to improve the efficiency with which bias may be supplied to the transistors of the circuit. When the incremental resistance of the D–F network is high, the component of the output signal voltage that is directly related to the sum of the signal voltages applied to the base electrodes of transistors 3 and 4 is relatively small, while the component of the output voltage directly related to the difference of those signal voltages is relatively large. Good common mode rejection is especially important as the negative feedback ratio $\beta_1$ approaches unity.

Figure 3:
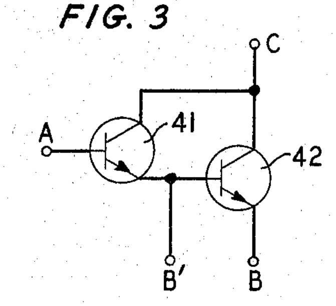
FIG. 3 is a schematic illustration of an alternative transistor arrangement for the output stage of the preferred embodiment.

Furthermore, transistor 9 may be replaced by the arrangement of FIG. 3, which comprises transistors 41 and 42.

The collectors of transistors 41 and 42 are connected together, and the emitter of transistor 41 is connected to the base of transistor 42. The base of transistor 41 is connected to the collector of transistor 4.

The circuit of FIG. 3 is distinctive in that the emitter of transistor 41 would be connected to point B′ at the input of neutralizing feedback circuit 25, and the emitter of transistor 42 would be connected to point B at the cathode of Zener diode 14. This arrangement provides somewhat more isolation between the feedback circuits 22 and 25 without affecting the basic principles of operation of the circuit.

It should be apparent that the battery bias supplies 6 and 8 could be replaced with one or more alternating current-energized rectifier units, and that Zener diode 14 could be replaced with any other constant voltage device that has a low dynamic impedance that is substantially independent of frequency over the intended frequency range of operation. Zener diode 14 is advantageous because it presents a low dynamic impedance and a constant voltage for biasing the collectors of transistors 3 and 4 and the emitter of transistor 9, while these characteristics are independent of frequency over the intended frequency range of operation.

In all cases, it is understood that the above-described arrangements are illustrative of a small number of the many specific embodiments that can represent applications of the principles of the invention. Numerous and varied other arrangements can readily be devised in accordance with these principles by those skilled in the art without departing from the spirit and scope of the invention.

What is claimed is:

1. A direct-coupled transistor differential amplifier comprising first and second transistors having first and second base electrodes, first and second emitter electrodes and first and second collector electrodes, respectively; a common emitter resistor for said first and second emitter electrodes; means for biasing said emitter electrodes through said emitter resistor at a direct current potential level having a first polarity with respect to said first base electrode, a collector load resistor connected between said second collector electrode and said biasing means to bias said second collector electrode at a direct current potential level having the opposite polarity with respect to said first base electrode, said first base electrode and an intermediate connection of said biasing means comprising an input circuit for said amplifier to receive an input signal, said intermediate connection having substantially zero direct current potential with respect to said first base electrode, said input signal producing an amplified signal at said second collector electrode, means for applying a negative feedback signal that is derived from and in phase with said amplified signal to said second base at substantially zero direct current potential level with respect to said first base electrode, and means for applying a neutralizing feedback signal that is derived from and in phase with said amplified signal to said first collector electrode at a direct current potential level having said opposite polarity with respect to said first base electrode.

2. A circuit for amplifying electrical signals applied to the input thereof, comprising first and second transistors having respective base, emitter and collector electrodes, said emitter electrodes being connected in common; a circuit element connected to said commonly connected emitters; a source of biasing potential having a first portion thereof connected in series with said circuit element and said base and emitter electrodes of said first transistor across said input in a polarity to promote conduction in said first transistor; a collector load element connected in series with said collector and emitter elements of said second transistor and said circuit element across said biasing source; and an output amplifier having a signal input coupled to said collector load element, said output amplifier including a negative feedback circuit connected across the series combination of said base and emitter electrodes of said second transistor, said circuit element and said portion of said biasing source, said output amplifier including a neutralizing feedback circuit connected across the series combination of said input and said collector and base electrodes of said first transistor in a polarity to vary the potential of said first collector electrode in synchronism with the potential of said first base electrode, said output amplifier having biasing connections to said source of biasing potential to receive biasing current and supply part of said biasing current serially through said neutralizing feedback circuit to said first emitter and collector electrodes.

3. A circuit according to claim 2 in which the output amplifier includes third and fourth transistors having base, emitter and collector electrodes, said emitter and collector electrodes of said third and fourth transistors being connected serially with the emitter and collector electrodes of the first transistor across said biasing source, said base electrode of said third transistor being connected to the collector electrode of the second transistor, said base electrode of said fourth transistor being connected to the bias source at an intermediate potential level.

4. A circuit according to claim 3 including a utilization circuit connected serially with the emitter and collector electrodes of said fourth transistor across said source.

5. A direct-coupled transistor differential amplifier comprising first and second transistors having first and second base electrodes, first and second emitter electrodes and first and second collector electrodes, respectively, a common emitter resistor for said first and second emitter electrodes, means for biasing said emitter electrodes through said emitter resistor at a direct current potential level having a first polarity with respect to said first base electrode, a collector load resistor connected between said second collector electrode and said biasing means to bias said second collector electrode at a direct current potential level having the opposite polarity with respect to said first base electrode, said first base electrode and an intermediate connection of said biasing means comprising an input circuit for said amplifier to receive an input signal, said intermediate connection having substantially zero direct current potential with respect to said first base electrode, said input signal producing an amplified signal at said second collector electrode, an output amplifier having an input circuit connected to said second collector electrode to receive a signal therefrom and having an output circuit connected to said second base electrode to apply a negative feedback signal that is in phase with said amplified signal to said second base electrode at substantially zero direct current potential level with respect to said first base and a neutralizing feedback circuit connected to said output amplifier and to said first collector electrode to apply a neutralizing feedback signal that is in phase with said amplified signal to said first collector electrode, said output amplifier including a Zener diode connected between said negative feedback circuit and said neutralizing feedback circuit to maintain said first collector electrode at a direct current potential level having said opposite polarity with respect to said first base electrode.

6. A transistor amplifier comprising first and second transistors each having an emitter electrode, a base electrode and a collector electrode connected in differential amplifier configuration, said first transistor being adapted to receive an input signal and said second transistor having a collector load impedance, a third transistor having emitter, base and collector electrodes coupled to said second transistor and said collector load impedance in power-amplifying arrangement, and an emitter-circuit impedance for said third transistor including a negative feedback circuit direct-coupled to said second transistor and a positive feedback circuit direct-coupled to the collector of said first transistor in an arrangement to neutralize the base-collector impedance of said first transistor and to energize said first and third transistors serially for power, said emitter circuit impedance including a constant voltage device connected between said negative and positive feedback circuits to stabilize voltage biases for said first and second transistors.

7. An amplifier circuit comprising an input and an output, first, second, third and fourth transistors having base, emitter and collector electrodes, a bias voltage source having an intermediate potential point connected to one side of said input, the base electrode of said first transistor being connected to the other side of said input, a first circuit returning said emitters of said first and second transistors to one side of said bias voltage source, a second circuit returning said collector electrode of said second transistor to the other side of said biasing source, a third circuit including a series connection between said collector and emitter electrodes of said third and fourth transistors returning said collector electrode of said first transistor to said other side of bias voltage source, said base electrode of said third transistor being connected to said second circuit, a first constant device connecting said base electrode of said fourth transistor to said intermediate potential point, and a fourth circuit including a second constant voltage device connecting said third circuit to said base electrode of said second transistor.

8. A direct-coupled transistor differential amplifier comprising first and second transistors having first and second base electrodes, first and second emitter electrodes and first and second collector electrodes, respectively; a common emitter resistor for said first and second emitter electrodes; means for biasing said emitter electrodes through said emitter resistor at a direct current potential level having a first polarity with respect to said first base electrode; a collector load resistor connected between said second collector electrode and said biasing means to bias said second collector electrode at a direct current potential level having the opposite polarity with respect to said first base electrode, said first base electrode and an intermediate connection of said biasing means comprising an input circuit for said amplifier to receive an input signal, said intermediate connection having substantially zero direct current potential with respect to said first base electrode, said input signal producing an amplified signal at said second collector electrode; third and fourth transistors having third and fourth base electrodes, third and fourth emitter electrodes and third and fourth collector electrodes, respectively; means for coupling said third base electrode to said second collector electrode; means connecting said fourth transistor as a common-base buffer amplifier for driving said fourth emitter electrode from said third collector electrode; a power transformer and a load coupled to said fourth collector electrode; a negative feedback circuit coupled to said third emitter electrode and to said second base electrode to drive said second base electrode in split-phase relationship to said fourth emitter electrode and to supply a bias current of said third transistor to said second base and emitter electrodes, said negative feedback circuit including a Zener diode connected between said third emitter electrode and said second base electrode to maintain said third emitter electrode at a direct current potential level having said opposite polarity with respect to said first and second base electrodes; and a neutralizing feedback circuit coupled to said third emitter electrode and to said first collector electrode to drive said first collector electrode in split-phase relationship to said fourth emitter electrode and to supply a bias current of said third transistor to said first collector and emitter electrodes, said neutralizing feedback circuit being connected to said Zener diode to maintain said first collector electrode at a direct current potential level having said opposite polarity with respect to said first and second base electrodes.

References Cited by the Examiner

UNITED STATES PATENTS 3,137,826 6/1964 Boudrias.

FOREIGN PATENTS 1,295,540 5/1962 France.

References Cited by the Applicant

UNITED STATES PATENTS 2,852,625 9/1958 A. Nuut.
2,942,200 6/1960 R. A. Hanel et al.

OTHER REFERENCES

Electronics: "High Input Impedance," pages 50 through 52, September 1960.

ROY LAKE, *Primary Examiner.*

F. D. PARIS, *Assistant Examiner.*